United States Patent [19]
Ito et al.

[11] Patent Number: 5,232,870
[45] Date of Patent: Aug. 3, 1993

[54] METHOD FOR PRODUCTION OF BONDED WAFER

[75] Inventors: Tatsuo Ito, Niigata; Yasuaki Nakazato, Nagano, both of Japan

[73] Assignee: Shin-Etsu Handotai Co., Ltd., Japan

[21] Appl. No.: 754,767

[22] Filed: Sep. 4, 1991

[30] Foreign Application Priority Data

Sep. 10, 1990 [JP] Japan .................................. 2-240765

[51] Int. Cl.⁵ ............................................. H01L 21/34
[52] U.S. Cl. ...................................... 437/173; 437/86; 437/974; 148/DIG. 12
[58] Field of Search ............. 148/DIG. 12, DIG. 135; 437/86, 225, 974, 173

[56] References Cited

PUBLICATIONS

Wolf, S., et al., *Silicon Processing for the VLSI Era: vol. 1: Process Technology*, 1986, p. 219.
Haisma, J., et al., "Silicon on Insulator Wafer Bonding Wafer Thinning . . . ", Jap. J. Appl. Phys., vol. 28, No. 8, Aug. 1989, pp. 1426-1443.

*Primary Examiner*—George Fourson
*Attorney, Agent, or Firm*—Townsend, Snider & Banta

[57] ABSTRACT

A bonded wafer enjoying high strength of bonding of component wafers thereof is produced by a method which comprises causing the surfaces for mutual attachment of two semiconductor wafers to be irradiated with an ultraviolet light in an atmosphere of oxygen immediately before the two semiconductor wafers are joined to each other. One of the two semiconductor wafers to be used for the bonded wafer optionally has an oxide film formed on one surface thereof. One of the component wafers of the bonded wafer is optionally polished until the component wafer is reduced to a thin film.

10 Claims, 3 Drawing Sheets

METHOD FOR PRODUCTION OF BONDED WAFER

BACKGROUND OF THE INVENTION

1. Field of the Invention

This invention relates to a method for the production of a bonded wafer comprising two integrally joined wafers.

2. Description of the Prior Art

As a means for bonding semiconductor wafers, the method of bonding a single crystal silicone wafer superposed on a single crystal silicon wafer through the medium of an organic or inorganic adhesive agent has been available to date. This method entails the disadvantage that the part of adhesive bonding in the produced bonded wafer, on thermal expansion, develops stress and manifests strain.

For the solution of this problem, Japanese Patent Publication SHO 62(1987)-27,040 discloses a method which effects bonding of two single crystal silicon wafers by subjecting the surfaces thereof intended for contact to a treatment for impartation of hydrophilic property, then putting them into close mutual attachment, and treating them at an elevated temperature. By this method, the bonding is attained without use of an adhesive agent.

Japanese Patent Application Disclosure SHO 62(1987)-283,655 discloses a method which effects bonding of two semiconductor wafers after causing the surfaces thereof intended for contact to be etched in a vacuum or in an atmosphere of inert gas.

More recently, in view of the prevalent trend of semiconductor devices toward three-dimensional configuration, high voltage breakdown, and dielectric separation between adjacent component elements, wafers of the silicon on insulator (SOI) configuration have come to attract special attention. This configuration comprises two single crystal silicon wafers and an silicon oxide film interposed as an insulating film therebetween.

As a means for the production of a wafer of the SOI configuration, Japanese Patent Publication SHO 62(1987)-34,716 discloses a method for producing an integral thin film of single crystal silicon by forming a thermal oxide film on the surface of a single crystal silicon wafer, forming along the peripheral part of the single crystal silicon wafer a single crystal projected part integrally continuing therefrom, covering the thermal oxide film with a polycrystalline or amorphous silicon film, and causing an energy beam such as an electron beam or a laser beam to irradiate the silicon film linearly and unidirectionally thereby linearly melting the silicon film, and cooling and solidifying the molten silicon film.

This method, however, is found such that though the conversion of the silicon film into a single crystal is partially attained by the interaction of the molten silicon with the oxide film, it is difficult to obtain a single crystal silicon film which privents the method from actual use.

As a means of overcoming this problem and allowing production of a wafer of the SOI configuration by bonding, a method which produces a bonded wafer by directly bonding two single crystal silicon wafers having an oxide film formed on the surface thereof and then reducing one of the silicon wafers into a thin film by etching away the surface region thereof has been disclosed [Tadayoshi Enomoto: "Nikkei Microdevices," No. 15, page 39 (Sep., 1986); and Lasky, Stiffer, White, and Abernathy: "Digest of the IEEE Int. Elec. Device Meeting (IEDM)," page 688 (Dec. 1985)]. To be specific, a high-concentration n+ silicon substrate having a low-concentration n− epitaxial layer formed on the surface thereof and a low-concentration supporting silicon substrate for supporting are prepared and thermal oxide films are formed one each on the opposed surfaces of the two substrates. Then, the coated substrates are mutually superposed, pressed closely against each other, and heat-treated in an oxidizing atmosphere at 700° C. thereby to complete bonding of the $SiO_2$ layers. The variation of the silicon oxide film in thickness from the level of natural oxide film to 520 nm has been demonstrated experimentally Incidentally, the mechanism of the bonding is explained as follows. First, when the $O_2$ gas present between the wafers is converted into $SiO_2$, a vacuum part is partially produced and the wafers are forced to stick fast at the part to each other. Once this fast stick is produced, the bonding between the wafers is eventually completed followed by the reactions of hydrogen bonding and dehydration condensation. Then, the SOI configuration is completed by removing the n+ silicon substrate through selective etching while allowing the n− epitaxial layer to remain intact.

The method disclosed in Japanese Patent Publication SHO 62(1987)-27,040, however, has the disadvantage that since the wet process using a liquid treating agent is adopted for the treatment of the opposed surfaces for bonding for the impartation of hydrophilic property, the joined surfaces not only introduce a hydrophilic atomic group but also suffer persistence of various kinds of impurities and these defiling substances, on exposure to a heat treatment, form faults, exert adverse effects on electric properties, and obstruct thorough purification which is indispensable to high integration of any semiconductor device. Further, the strength of bonding is not sufficient owing to the presence of such defiling substances.

The method disclosed in Japanese Patent Application Disclosure SHO 62(1987)-183,655 is capable of solving the drawback of the invention of Japanese Patent Publication SHO 62(1987)-27,040 because it basically effects the etching of the opposed surfaces before their mutual attachment by a dry process. This method, however, has the disadvantage that since this etching process necessitates an expensive and voluminous apparatus and entails a time-consuming work of setting conditions as for the creation of a vacuum prior to the actual etching work, the cost of production is very high and the method is commercially feasibilized only with difficulty.

Further, the method which produces the wafer of the SOI configuration by the bonding described above suffers from the same problem as the method of Japanese Patent Publication SHO 62(1987)-27,040 because it pays no special attention to the presence of defiling substances in the opposed surface prior to bonding. Moreover, the operation of etch back Which is performed in decreasing the wall thickness of one of the two joined wafers necessitates an expensive and voluminous apparatus and jeopardizes the commercial feasibility of the method because the time, ion source, power source, etc. which are required for the etch-back operation invariably contribute to an addition to the cost of production.

SUMMARY OF THE INVENTION

Figure 1A:
FIGS. 1a to 1d are explanatory diagrams illustrating a process for effecting bonding of two silicon wafers and FIGS. 2a to 2f are explanatory diagrams illustrating a process for effecting bonding of a silicon wafer with a silicon wafer provided with a thermal oxide film.

This invention has been produced for the elimination of the drawbacks of prior art mentioned above. An object of this invention is to provide a bonded wafer which is produced by joining two semiconductor wafers after the surfaces thereof intended for mutual attachment are purged to a high degree so that the surfaces of bonding are free from defiling substances and the two wafers are bonded with great strength.

The other objects and characteristic features of this invention will become apparent from the following description of the invention.

The first aspect of this invention is directed to a method for the production of a bonded wafer which is characterized by the fact that in the process for production of the bonded wafer, the surfaces of two semiconductor wafers which are intended for mutual attachment are irradiated with an ultraviolet light in an atmosphere of oxygen immediately before the two semiconductor wafers are joined.

The second aspect of this invention is directed to a method for the production of a bonded wafer which is characterized by the fact that in the process for production of the bonded wafer, immediately before two semiconductor wafers at least one of which has an oxide film formed on one surface thereof are joined, the surfaces of the semiconductor wafers intended for mutual attachment are irradiated with an ultraviolet light in an ambient atmosphere of oxygen.

The third aspect of this invention is directed to a method for the production of a bonded wafer which is characterized by the fact that the surface of one of the two wafers of the bonded wafer produced by the first or second aspect of this invention is polished to decrease the film thickness.

DETAILED DESCRIPTION OF THE INVENTION

The semiconductor wafers are polished to a mirror finish and then washed with an acid, an alkali, and an organic solvent before they are joined. After the semiconductor wafers are washed by the wet process using such liquid detergents, the defiling substances of C, H, F, and Cl which originate in the detergents adhere to the surfaces of the semiconductor wafers intended for mutual attachment. These defiling substances have defied quantitative analysis because the conventional method of surface analysis cannot fully detect the presence of these defiling substances. An attempt to analyze the surfaces by the method of secondary ion mass spectroscopy (SIMS) fails to give quantitative analysis of the defiling substances adhering to the true surfaces subjected to analysis because the SIMS method requires a length of time before the secondary ions released from the surfaces are stabilized and, as a result, the surfaces subjected to analysis are cut away and inner textures are exposed as new surfaces by the time the secondary ions are stabilized.

The present inventors have rendered it possible to accomplish quantitative analysis of a given semiconductor wafer in the direction of thickness from the surface by superposing other semiconductor wafer on the given semiconductor wafer without interposition of any adhesive agent therebetween, putting them into close mutual bonding, heating them and completing their bonding, polishing the other semiconductor wafer side of the produced bonded wafer thereby decreasing the wall thickness of the bonded wafer, causing an ion beam of up to 10 kev to irradiate the bonded wafer from the thinned film side, and performing mass analysis on the secondary ions generated in the form of neutral specie or ions by the spattering of component atoms of the wafer. By the analysis performed in accordance with this method, the surfaces of the semiconductor wafers of the bonded wafer produced by the conventional wet process are found to have various kinds of defiling substances deposited thereon, whereas the surfaces of two semiconductor wafers intended for mutual attachment irradiated with an ultraviolet light in an atmosphere of oxygen immediately before bonding of the wafers as contemplated by the present invention are found to be purged of such defiling substances to a high degree.

In the present invention, since the surfaces of silicon wafers, optionally including a silicon wafer having an oxide film formed on one surface thereof, intended for mutual attachment are irradiated with an ultraviolet light in an atmosphere of oxygen prior to their bonding, the ozone which is consequently generated decomposes and expels the defiling substances adhering to the irradiated surfaces. As a result, the bonded wafer exhibits high strength of bonding and possesses a highly purged interface. When a semiconductor device is built in this bonded wafer, various troubles due to the presence of defiling substances such as the occurrence of defects resulting from the exposure of the defiling substances to a heat treatment and the exertion of adverse effects on electric properties can be prevented.

Further, since the purgation with the ozone is carried out immediately prior to the bonding, the adhesion of fine dirt to the purged surfaces cannot occur and the occurrence of unbonded areas due to voids resulting from adhesion of dirt can be precluded. Thus, the bonded wafer all the more enjoys high strength of bonding.

EXAMPLE

Now, the present invention will be described more specifically below with reference to working examples.

Bonding of two silicon wafers

First, two silicon wafers having a mirror finished surface are prepared. The mirror finished surfaces of these two silicon wafers are used for mutual attachment. These surfaces for mutual attachment are desired to have roughness, Ra, of not more than $0.4\mu$ m. If the roughness exceeds $0.4\ \mu$ m, unbonded areas called voids occur in the interface of bonding and the produced bonded wafer suffers from inferior strength of bonding. After the mirror polishing, the surfaces for mutual attachment are washed as with $NH_3/H_2O_2$, $H_2SO_4/H_2O_2$, $HCl/H_2O_2$, $HF$, or $i\text{-}C_3H_7OH$ to expel therefrom the adhesive agent used in keeping the wafer fast on the carrier plate during the polishing, the abrasive, and the particles produced by the polishing. After the washing, such defiling substances as C, H, F, and Cl which originate in the liquid detergents are adhering to the washed surfaces. Thus, the defiling substances are removed from surfaces 3 of a Si bond wafer 1 and a Si base wafer 2 as illustrated in FIG. 1a before these wafers are joined. The washing of the surfaces 3 is accomplished by irradiating these surfaces with an ultraviolet light in an atmosphere of oxygen, causing the ozone consequently generated to purge the surfaces 3, and depriving the surfaces 3 of the adhering defiling substances owing to the decomposition and expulsion of the defiling substances by the addition of the ozone. Generally, oxygen forms ozone by absorbing an ultraviolet light of a wavelength of 184.9 nm and the ozone undergoes decomposition by absorbing an ultraviolet light of a wavelength of 253.7 nm. The atomic oxygen which is generated during the formation and decomposition of ozone acts as a particularly strong oxidizing agent on the defiling substances and decomposes them. Thus, the irradiation is desired to be made with ultraviolet lights of the two wavelengths of 184.9 nm and 253.7 nm. This irradiation induces continuous formation and decomposition of ozone and accelerates the speed of decomposition of the defiling substances. The speed of decomposition of the defiling substances increases in proportion as the distance between the surface of the Si bond wafer 1 for attachment and an ultraviolet lamp 4. This distance is desired to be approximately 5 mm.

Figure 1B:
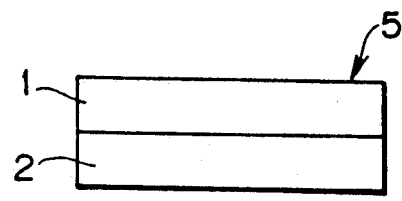

After the surface 3 of the Si bond wafer 1 for attachment has been washed, the two surfaces 3 for mutual attachment are laid on each other, attached fast to each other, and subjected to a heat-treatment in an atmosphere of $N_2$ or an oxidative atmosphere, with the result that a bonded wafer 5 illustrated in FIG. 1b is obtained. Here, the heating temperature is desired to be not lower than 1100° C. and the heating time to be approximately two hours.

The bonding of the wafers 1, 2 is to be carried out immediately after the surfaces 3 for mutual attachment have been washed. If the surfaces 3 so washed are left standing, the fine dirt floating in the ambient air adheres to the washed surfaces to deprive the surfaces of their cleanliness and induce the formation of voids in the interface of bonding when the surfaces are joined and give the produced bonded wafer inferior strength of bonding.

Figure 1C:
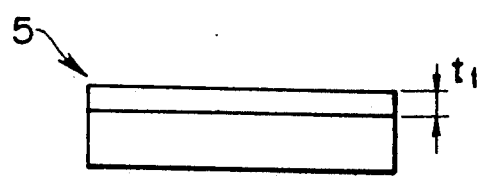

Then, the surface of the Si bond wafer 1 forming the upper layer of the bonded wafer is prepolished (primary polishing) until the wafer 1 decreases to a predetermined thickness, $t_1$ ( 6 $\mu$ m, for example), inclusive of a predetermined stock of removal( 3$\mu$ m, for example) [FIG. 1c]. It is further subjected to secondary polishing until the Si bond wafer 1 as the upper layer is decreased to a thickness, $t_2$[3$\mu$ m, for example) and hence is converted into a thin film, with the result that a bonded wafer 5 is obtained as illustrated in FIG. 1d.

A bonded wafer obtained by the method described above, when tested for strength of bonding, was found to produce no separation all over the interface of bonding but allow separation to occur only in the part of contact between the tensile jig of the tensile tester and the bonded wafer under a tensile stress exceeding 800 kg/cm², indicating that this bonded wafer possessed high strength of bonding.

In a comparative test, a bonded wafer produced under the same conditions, except the irradiation of the washed surfaces of a Si bond wafer and a Si base wafer with an ultraviolet light was omitted, yielded to separation of the component wafers under a tensile stress of not more than 200 kg/cm².

Figure 1D:
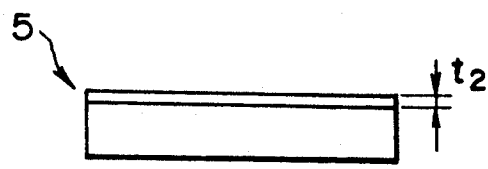

When the Si bond wafer side surface of a bonded wafer constructed as illustrated in FIG. 1d was subjected to the SIMS analysis as to the distribution of defiling substances in the direction of thickness of the bonded wafer, the interface of bonding was purged to a high degree.

For comparative experiments, the surfaces of a Si bond wafer and a Si base wafer were finally washed with a varying detergent, $HCl/H_2O_2$ or HF, the washed wafers were irradiated with an ultraviolet light under the same conditions as described above, and the wafers were joined to obtain a bonded wafer. The irradiated surfaces prior to the bonding and the Si bond wafer side surface of the finally produced bonded wafer were subjected severally to the SIMS analysis as to the defiling substances. The results of the SIMS analysis in the working example and the comparative experiment are shown in Table 1.

It is clearly noted from Table 1 that the contents of oxygen, hydrogen, nitrogen, carbon, chlorine, and fluorine were decisively lower and nearly close to those of wafer bulk in the sample of the working example.

TABLE 1

| Subject element of analysis | Comparative Experiment 1 Washed with $HCl/H_2O_2$ | Comparative Experiment 2 Washed with HF | Unit: atoms/cc Example Washed with HF |
|---|---|---|---|
| O  | $2.0 \times 10^{20}$ | $1.5 \times 10^{19}$ | $1.0 \times 10^{18}$ |
| H  | $7.0 \times 10^{17}$ | $4.5 \times 10^{17}$ | $4.5 \times 10^{17}$ |
| N  | $1.5 \times 10^{19}$ | $1.5 \times 10^{18}$ | $5.0 \times 10^{16}$ |
| C  | $1.5 \times 10^{18}$ | $3.0 \times 10^{18}$ | $1.5 \times 10^{16}$ |
| Cl | $5.0 \times 10^{16}$ | $1.5 \times 10^{16}$ | $5.0 \times 10^{15}$ |
| F  | $1.5 \times 10^{15}$ | $1.5 \times 10^{17}$ | $1.5 \times 10^{14}$ |

Bonding between silicon wafer having a thermal oxide film formed on one surface thereof and silicon wafer having no thermal oxide film.

FIGS. 2a to 2f are explanatory diagrams illustrating a process for the production in accordance with the method of the present invention.

Figure 2A:
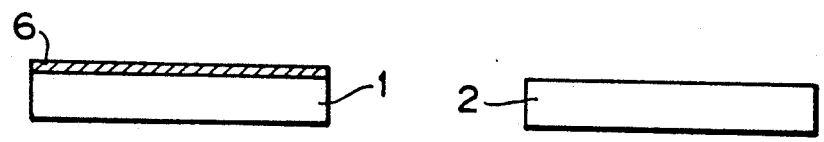

First, the surfaces of two silicon wafers intended for mutual attachment are polished to specular finish in the same manner as in the preceding example and then washed with liquid detergents. Then, of the two wafers, the Si single crystal bond wafer 1 destined to offer a surface for the formation of an element is subjected to a thermal oxidation treatment in an oxidative atmosphere to form an oxide ($SiO_2$) film 6 on the Si bond wafer 1 as illustrated in FIG. 2a. For this thermal oxidation treatment, the heating temperature is desired to be in the range of from 800° C. to 1,000° C. The thickness of the oxide film 6 is desired to be approximately 500 nm.

Besides the Si bond wafer 1, a similar Si single crystal base wafer 2 destined to serve as a base material is prepared.

Figure 2B:
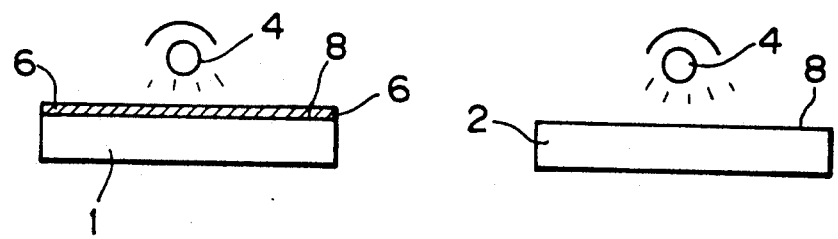
Figure 2C:
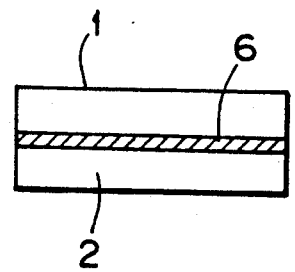
Figure 2D:
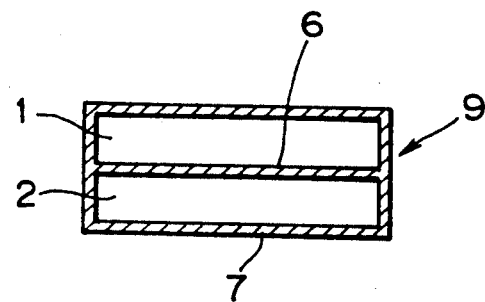

Then, the two wafers are irradiated as illustrated in FIG. 2b with an ultraviolet light in an atmosphere of oxygen in the same manner as in the preceding example to expel the defiling substances adhering to the surfaces 3 of the Si bond wafer 1 and the Si base wafer 2. After the washing is completed, the bond wafer 1 is immediately superposed on the Si base wafer 2 so as to prevent the washed surfaces from otherwise possible deposition of fine dirt. The superposed wafers 1, 2 are subjected to a thermal oxidation treatment in an atmosphere of $N_2$ or in an oxidative atmosphere at a temperature of about 1,100° C. for a period of about 120 minutes to enhance the strength of bonding and an oxide ($SiO_2$) film 7 is formed on the entire surfaces of the two wafers 1, 2 in a thickness of about 500 nm.

The wafers 1, 2 joined as described above are cooled. The surface of the Si bond wafer 1 forming the upper layer of the bonded wafer is prepolished (primary polishing) until the wafer 1 is decreased to a stated thickness, $t_1$ (6μ m, for example) inclusive of a stated sock of polishing (3μ m, for example) as illustrated in FIG. 2e.

Figure 2E:
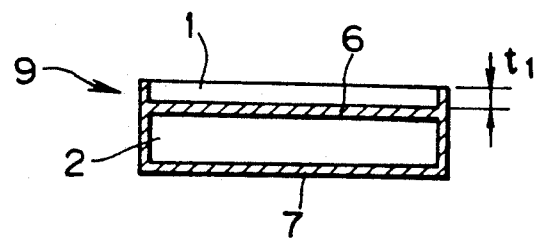
Figure 2F:
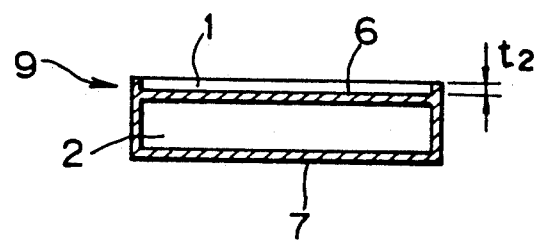

Then, the bond wafer 1 [FIG. 2e] prepolished to the thickness of $t_1$ is subjected to secondary polishing until the wafer 1 is decreased to a thickness, $t_2$ (3μ m, for example) and hence is converted into a thin film, with the result that a bonded wafer 9 illustrated in FIG. 2f is obtained.

This bonded wafer, when tested for strength of bonding, produced no separation along the interface of bonding but allowed separation to occur in the part of contact between the tensile testing machine and the bonded wafer under a tensile stress of 800 kg/cm$^2$, indicating that this bonded wafer possessed high strength of bonding.

In a comparative test, a bonded wafer produced by bonding a bond wafer provided with an oxide film and a base wafer exclusively of a specular surface without the irradiation with an ultraviolet light showed a strength of bonding not exceeding 110 kg/cm$^2$.

When the Si bond wafer side surface of a bonded wafer illustrated in FIG. 2f was subjected to the SIMS analysis as to the distribution of defiling substances in the direction of thickness, the contents of such defiling substances were substantially equal to those of a highly purged wafer bulk. This example has been described as producing a bonding in which an oxide film is formed on only one of two silicon wafers. Optionally, oxide films may be formed one each on one surface of each of the two silicon wafers and the oxide film side surfaces of the silicon wafers may be joined to each other in the same manner as described above.

As is clear from the description given above, this invention washes the surfaces of semiconductor wafers by the dry process of irradiation with an ultraviolet light in an atmosphere of oxygen and, therefore, purges to a high degree the surfaces of adhering defiling substances without leaving behind such defiling atoms originating in liquid detergents which would be used in a wet process. Since the semiconductor wafers so purged to a high degree are superposed one on the other, brought into tight mutual contact, and joined to each other. They produce a bonded wafer enjoying high strength of bonding because they have nothing to obstruct their bonding. Further, since the interface of bonding is purged to a high degree of defiling substances, various troubles such as the formation of defects due to the exposure of defiling substances to a heat treatment and the exertion of adverse effects on electric properties can be precluded.

The reduction of the one surface side wafer of the bonded wafer into a thin film is effected by polishing and, therefore, finds no use for such an expensive apparatus as would be required in the work of etch back. The polishing shortens the time required for the reduction of the wafer into the thin film and notably alleviates time and labor.

What is claimed is:

1. A method for the production of a bonded semiconductor wafer which is characterized by the fact that in the process for production of said bonded wafer, the surfaces of two semiconductor wafers which are to be bonded are washed with a fluid which leaves defiling substances on said surfaces and said surfaces are irradiated with an ultraviolet light in an atmosphere of oxygen before said two semiconductor wafers are bonded.

2. A method for the production of a bonded semiconductor wafer, wherein at least one wafer has an oxide film formed on one surface thereof and, the surface of said one semiconductor wafer and a second semiconductor wafer intended for mutual bonding are washed with a fluid which leaves defiling substance on said surfaces and said surfaces are irradiated with an ultraviolet light in an atmosphere of oxygen.

3. A method for the production of a bonded wafer in accordance with claim 1 wherein said bonded wafer is polished until a polished surface is removed to form a thin semiconductor film above the bonding surface.

4. A method of producing semiconductor bonded wafers by joining principal surfaces of two semiconductor wafers together, said method comprising:
   (a) smoothing the principal surfaces of said two wafers by mirror polishing;
   (b) washing with a fluid which leaves defiling substances on said surfaces;
   (c) irradiating the mirror polished surfaces of said two wafers with a ultraviolet light in the presence of oxygen;
   (d) directly contacting the mirror polished surfaces of said two wafers to each other during irradiating; and
   (e) bonding said surfaces giving a thermal treatment to said wafers while being held in contact at a temperature of no lower than 1100° C. at least for two hours.

5. A method of producing semiconductor bonded wafers by joining principal surfaces of first and second semiconductor wafers together, said method comprising:
   (a) smoothing the principal surfaces of said first and second wafers by mirror polishing; first mirror polished wafer in an oxidizing atmosphere;
   (b) thermal oxidizing the principal surface of said first mirror polished wafer in an oxidizing atmosphere;
   (c) washing with a fluid which leaves defiling substances on said surfaces;
   (d) irradiating the oxidized principal surface of said first wafer and the mirror polished principal surface of said second wafer with a ultraviolet light in the presence of oxygen;
   (e) directly contacting the thermal oxidized surface of said first wafer and the mirror polished surface of said second wafer to each other during irradiating; and
   (f) giving a thermal treatment to said wafers while being held in contact at a temperature no lower than 800° C.

6. A method for the production of a bonded semiconductor wafer in accordance with claim 2, wherein said bonded wafer is polished until a polished surface is removed to form a thin semiconductor film above the bonding surface.

7. The method for production of a bonded semiconductor wafer in accordance with claim 1, wherein said fluid is selected from the group consisting of NH$_3$/H$_2$O$_2$, H$_2$SO$_4$/H$_2$O$_2$, HCl/H$_2$O$_2$, HF, and i-C$_3$H$_7$OH.

8. The method for production of a bonded semiconductor wafer in accordance with claim 2, wherein said fluid is selected from the group consisting of NH$_3$/H$_2$O$_2$, H$_2$SO$_4$/H$_2$O$_2$, HCl/H$_2$O$_2$, HF, and i-C$_3$H$_7$OH.

9. The method for production of a bonded semiconductor wafer in accordance with claim 4, wherein said fluid is selected from the group consisting of $NH_3/H_2O_2$, $H_2SO_4/H_2O_2$, $HCl/H_2O_2$, HF, and i-$C_3H_7OH$.

10. The method for production of a bonded semiconductor wafer in accordance with claim 5, wherein said fluid is selected from the group consisting of $NH_3/H_2O_2$, $H_2SO_4/H_2O_2$, $HCl/H_2O_2$, HF, and i-$C_3H_7OH$.

* * * * *